United States Patent
Biolsi et al.

(10) Patent No.: US 8,614,150 B2
(45) Date of Patent: *Dec. 24, 2013

(54) METHODS OF MANUFACTURING SEMICONDUCTOR STRUCTURES USING RIE PROCESS

(75) Inventors: Peter Biolsi, New Windsor, NY (US); Samuel S. Choi, Beacon, NY (US); Kevin MacKey, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 905 days.

This patent is subject to a terminal disclaimer.

(21) Appl. No.: 12/170,956

(22) Filed: Jul. 10, 2008

(65) Prior Publication Data

US 2009/0017632 A1    Jan. 15, 2009

Related U.S. Application Data

(63) Continuation of application No. 11/621,660, filed on Jan. 10, 2007, now Pat. No. 7,442,650.

(51) Int. Cl.
*H01L 21/302* (2006.01)

(52) U.S. Cl.
USPC ........... 438/712; 438/714; 438/729; 438/742; 438/744

(58) Field of Classification Search
USPC .......................... 438/712, 714, 729, 742, 744
See application file for complete search history.

(56) References Cited

U.S. PATENT DOCUMENTS

| | | | |
|---|---|---|---|
| 4,820,393 A | 4/1989 | Brat et al. | |
| 6,100,183 A | 8/2000 | Lu et al. | |
| 6,183,655 B1* | 2/2001 | Wang et al. | 216/68 |
| 6,531,404 B1 | 3/2003 | Nallan et al. | |
| 6,699,789 B2 | 3/2004 | Yang et al. | |
| 6,905,800 B1* | 6/2005 | Yuen et al. | 430/5 |
| 7,413,990 B2* | 8/2008 | Ye et al. | 438/700 |
| 7,442,650 B2* | 10/2008 | Biolsi et al. | 438/712 |
| 2002/0142573 A1 | 10/2002 | Yang et al. | |
| 2004/0063328 A1* | 4/2004 | Wen et al. | 438/706 |
| 2005/0014383 A1* | 1/2005 | Ji et al. | 438/710 |
| 2005/0026430 A1* | 2/2005 | Kim et al. | 438/689 |
| 2006/0216901 A1* | 9/2006 | Olewine et al. | 438/396 |
| 2008/0070128 A1* | 3/2008 | Wu et al. | 430/5 |

FOREIGN PATENT DOCUMENTS

| | | |
|---|---|---|
| JP | 63303062 | 6/1987 |
| JP | 63303066 | 5/1988 |
| JP | 5295534 | 4/1992 |
| JP | 6212417 | 4/1992 |
| JP | 6212418 | 4/1992 |
| JP | 6228747 | 2/1993 |
| TW | 0383462 | 3/2000 |
| TW | 0589390 | 6/2004 |
| TW | 0231962 | 5/2005 |
| WO | WO 0213241 | 2/2002 |

\* cited by examiner

*Primary Examiner* — Binh X Tran
(74) *Attorney, Agent, or Firm* — Matt Zehrer; Roberts Mlotkowski Safran & Cole, P.C.

(57) ABSTRACT

A method for etching on a semiconductors at the back end of line using reactive ion etching. The method comprises reduced pressure atmosphere and a mixture of gases at a specific flow rate ratio during plasma generation and etching. Plasma generation is induced by a source radio frequency and anisotropic etch performance is induced by a second bias radio frequency.

29 Claims, 3 Drawing Sheets

METHODS OF MANUFACTURING SEMICONDUCTOR STRUCTURES USING RIE PROCESS

CROSS-REFERENCE TO RELATED APPLICATIONS

This application is a continuation application of U.S. application Ser. No. 11/621,660, filed Jan. 10, 2007, now U.S. Pat. No. 7,442,650, the contents of which is incorporated by reference herein in its entirety.

FIELD OF THE INVENTION

The invention relates to methods of manufacturing semiconductor structures, and more particularly, to methods of manufacturing semiconductor structures using reactive ion etching (RIE) processes.

BACKGROUND OF THE INVENTION

In the fabrication of semiconductor devices at the BEOL level and prior to entering the damascene phase, it is crucial to provide vias that are appropriate for the first metallization step. These vias have to be free of any dielectric film to guarantee a conductive connection with the metal that is added in the next step. Furthermore, the surface of the vias should be smooth to allow for a homogenous phase transition when the metal is added. These vias are normally generated by an etching process.

The etching process of choice is in many cases reactive ion etching (RIE), which removes material using a gaseous chemical process in a radiofrequency field. The advantage of RIE is that the method can be used both anisotropically and isotropically. The anisotropic process finds application in nanotechnology. The isotropic process, on the other hand, finds application in all areas of microtechnology, including the cleaning steps for vias on silicon wafers.

A drawback of RIE is that the waste material, i.e., the material etched from the semiconductor surface, is not easily expurgated from the etch chamber and forms polymeric material. Over time and several RIE process repetitions, the waste material builds up inside the etch chamber. It follows that the polymeric build up interferes with subsequent RIE processes resulting in slower etch rates, degraded chamber performance amounting to decreased product quality. In order to maintain high yields, enhanced chamber maintenance and chamber cleaning are necessary causing production down time and increasing costs.

Another disadvantage is the destructive impact of current RIE processes onto the photosensitive top layer of a semiconductor devices. Intense sputtering conditions cause damages to the photosensitive layer and may have an exacerbating effect during subsequent steps.

For at least these shortcomings, it is desirable to apply methods that ensure manufacturability without compromising chamber performance, etch rates, and integrity of the semiconductor structure.

SUMMARY OF THE INVENTION

In a first aspect, the present invention is directed towards a method that comprises adjusting the pressure inside a chamber to about 75 millitorr or less. Two gases are introduced into the chamber for etching a layer above a bonding layer. The flow rates of the two gases are adjusted to give a predetermined flow ratio. The method further comprises application of a source radio frequency (RF) with a predetermined source power and application of a bias radio frequency at a predetermined bias power.

In a second aspect, the present invention is directed toward homogenously removing metallic or dielectric films on silicon wafers using the reactive ion etching method. In this method, a substrate comprising a metallic film or a dielectric film is placed in an etch chamber, the pressure inside the etch chamber is reduced and two gases, an etch gas and a supplemental gas, are introduced at a first and a second flow rates, respectively. The method further comprises applying a source radio frequency and a bias radio frequency at two different powers.

In a third aspect, the present invention is directed toward a method that reduces the foreign material buildup in etch chambers during reactive ion etching. The method comprises etching of metallic films or dielectric films in a dilute etch gas atmosphere. Dilution of the etch gas is achieved by using at least one gas from the group of helium, neon, argon, oxygen, and nitrogen. The flow rate ratio of etch gas:dilution gas is kept between 0.010 and 0.100 while the pressure in the chamber is kept between 30 and 50 millitorr. Etching is conducted by applying a source radio frequency between 250 and 750 Watts and a bias radio frequency between 1000 and 3000 Watts.

DETAILED DESCRIPTION OF THE EMBODIMENTS OF THE INVENTION

Figures 1, 2:
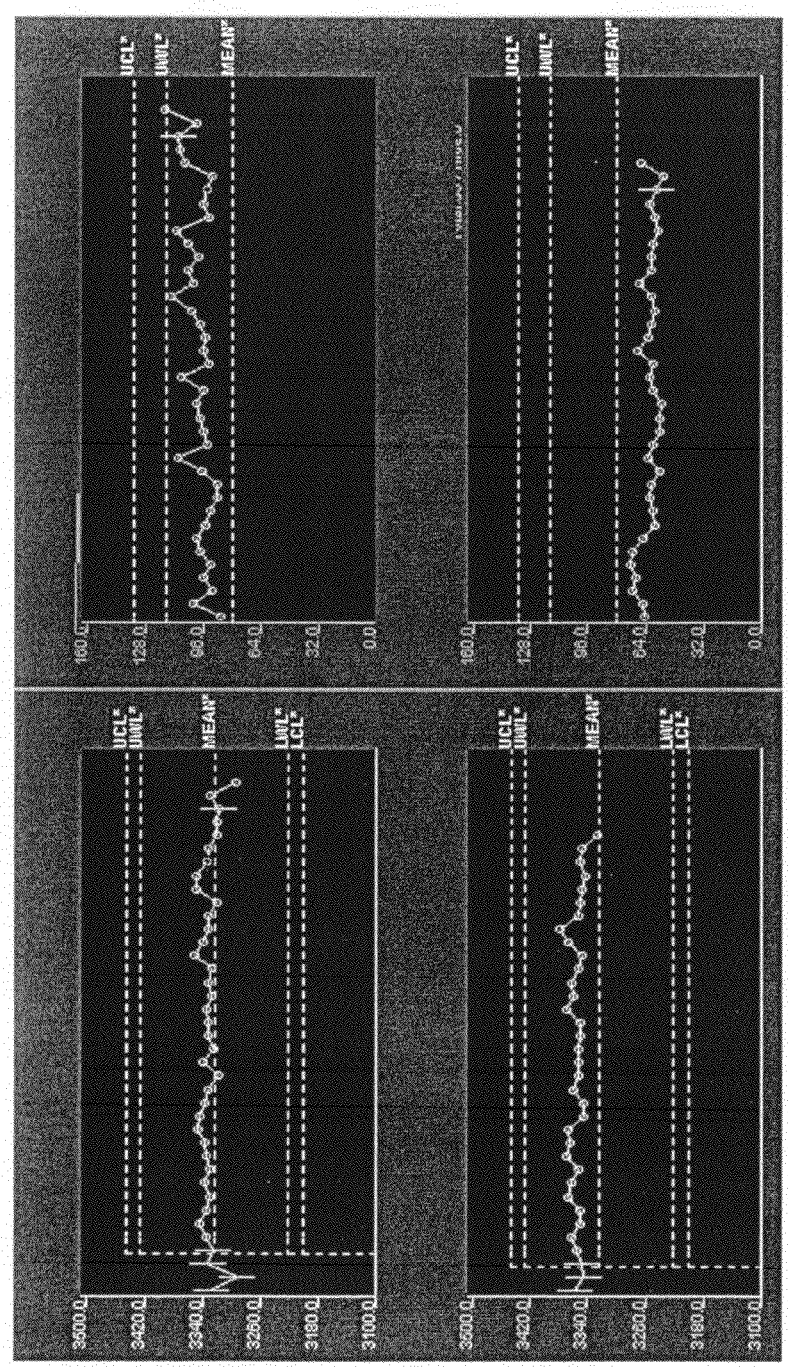
FIG. 1 illustrates chamber etch performance for two chambers, implementing the processes according to the invention.
FIG. 2 illustrates a variance of the etch performance of the corresponding etch performances in FIG. 1.

The invention relates to methods of manufacturing semiconductor structures, and more particularly, to methods of manufacturing semiconductor structures using reactive ion etching (RIE) processes. In embodiments, the invention provides a method for etching vias or removing layers of metals or dielectrics. The methods support accurate etch results while having low degradation of the etch chamber, which would otherwise impede subsequent processes.

In embodiments, the method of the invention uses reduced pressure and reactant gas flow ratio to minimize shift in chamber etch rate and uniformity. This reactive ion etching process of the invention, on large via pads, also minimizes surface roughness of the polymer mask and dielectric film.

In the etching process of large via level stacks, the LV-RIE process includes etching the nitride film, oxide film, and titanium nitride (TiN) film to expose the aluminum bond pad. In the methods of the invention, low pressure is used in the etching chamber to increase anisotropic etching and uniformity of sputtering to reduce overetching percent of the TiN film, and hence minimize electrode degradation. Also, since the TiN film is more metallic than dielectric, high ion energy is preferred for physical rather than chemical etching. However, some minimal amount of fluorine (e.g., $CF_4$) is used to remove the residual layer of oxide formed on top of the TiN film after etching the oxide stack.

In embodiments, the lowest $CF_4/Ar$ ratio and chamber pressure that results in uniform plasma is implemented by the processes of the invention. For example, Table 1 shows one set of processing steps in accordance with the invention. By using the processes of the invention, the $CF_4/Ar$ ratio and chamber pressure used to etch the TiN will not attack the upper silicon electrode of the chamber and will thus result in a uniform etching of the TiN film.

TABLE 1

| Film | Pressure | 60 MHz Power | 13.56 MHz Power | Gases |
|---|---|---|---|---|
| Nitride | 150 | 1500 | 1200 | 30/220/50/400 $CH_2F_2/CF_4/O_2/Ar$ |
| Oxide | 150 | 2000 | 2000 | 150/300 $CF_4/Ar$ |
| Titanium Nitride | 30 | 500 | 3000 | 50/1400 $CF_4/Ar$ |

Being more specific, in embodiments, a substrate, such as semiconductor device or a silicon wafer is set into a etch chamber. The inside pressure is adjusted by applying a vacuum and two gases are introduced at a certain flow rate ratio. One gas is the etch gas, the second is a dilution gas. Dilution of the etch gas allows for controllability of the etching. In embodiments, a controlled etching process benefits the homogenous removal of layers across the substrate in contrast to the use of non-diluted etch gas resulting in areas on the substrate with extensive removal and area with less than desired degradation. Furthermore, dilution of the etch gas equals to a reduction of undesired side effects, such as build up of foreign material inside the chamber or damaging the substrate in areas where degradation is undesired.

As discussed in greater detail below, the RIE of the present invention implements, in one illustrative example, the following processing conditions:
 a pressure condition of between about 30-50 millitorr;
 a bias RF power range of about 1000 to 3000 watts;
 a source RF power range of 250-750 watts; and
 gases of $CF_4$ and Ar with an optimum flow ratio of $CF_4/Ar$ of 0.0355 and which can range from about 0.020 to 0.050, depending on a chamber design.

More specifically, in embodiments, chamber pressures can be between 5 and 75 millitorr, more preferably between 15 and 60 millitorr, and most preferably between 30 and 50 millitorr. However, if desired for a particular chamber design, a pressure between 5 and 50 millitorr is contemplated by the invention.

In embodiments, the etch gas can be chosen according to chemical properties such as miscibility with the dilution gas or physical properties such as energy of the generated ionic species. In embodiments, gases such as tetrafluoromethane, difluoromethane, hexafluoroethane, perfluorated propanes, fluorated alkanes, fluorated alkenes, such as perfluorated butadienes, fluorated cyclic alkanes, fluorated aromates, and fluorated heteroaromates or inorganic gases such as sulfur hexafluoride and fluorine can be used with the invention.

In embodiments, the dilution gas can be inert and does not react with the ionic species or it can be partially react with the generated ionic species to form another desired ionic species and to modify the outcome of the sputtering process. Gases of the former kind are for example noble gases; while gases that may react with the ions are for example oxygen or nitrogen. In embodiments, dilution gases such as helium, neon, argon, xenon, nitrogen, and oxygen can be used with the invention; although oxygen and nitrogen should typically not be used for LV-integration when etching TiN film.

In embodiments, the etch gas can flow into the chamber is about between 1 and 1000 $cm^3$/min (standard cubic centimeter per minute), preferably between 2 and 500 $cm^3$/min, and more preferably between 5 and 100 $cm^3$/min. In embodiments, the flow rate of the etch gas is chosen at a certain flow rate of the dilution gas. Furthermore, it is contemplated to modify the flow rate during the process to either accelerate or decelerate the etch rate.

In embodiments, the flow rate of the dilution gas can be about between 5 and 5000 $cm^3$/min, preferably between 10 and 4000 $cm^3$/min, and more preferably between 100 and 2000 $cm^3$/min. Furthermore, it is contemplated to modify the flow rate during the process to either accelerate or decelerate the etch rate or quench the etching altogether. Moreover, it is contemplated to use a mixture of dilution gases, where necessary to achieve desired condition.

The flow rate of the etch gas and the dilution gas can be in any ratio. In embodiments for example, the flow rate ratio between etch gas and dilution gas can be between 0.005 to 0.500, more preferably between 0.010 to 0.100, and most preferably between 0.020 and 0.050.

Upon establishing the flow rate ratio of the two gases, etching is induced by applying a bias radio frequency of about between 5-30 MHz, preferably between 10-25 MHz, and most preferably at 13.5 MHz. The radio frequency bias power can be between 1000 and 4000 Watts, and preferably between 2000 and 3000 Watts. The bias radio frequency generates an anisotropic etch mode resulting in deep penetration of the substrate surface. An isotropic etch mode is generated by applying radio frequency of about 60 MHz. The power range of the source frequency can be between 100-1000 Watts, and preferably between 250-750 Watts range.

Without limiting the scope of the invention, the source frequency and bias frequency and/or their powers can be adjusted in any way to achieve the desired etch product. For example, if less ion bombardment or sputtering force is desired, the power of the bias frequency may be reduced. In other embodiments, if a more isotropic mode is desired, e.g., in order to etch wider vias, the source power may be increased without changing the bias power. In other embodiments when the material that is to be etched on the substrate changes, e.g., after removing a layer of metal oxide, a layer of titanium nitride is to be sputtered, the adjustments of the source and bias radiofrequencies are changed to continuer the etching in the most efficient way for the present substrate. For example and without limiting the scope of the invention, preferred conditions for etching titanium nitride are 3000 Watts at 13.56 MHz bias frequency, 500 Watts at 60 MHz source at a pressure of 30 milllitorr and a mixture of tetrafluoromethane and argon at a flow rate ratio of 50 $cm^3$/min:1400 $cm^3$/min. However, it is noted that any other combinations or settings are contemplated to result in improved etch products for any type of metal or dielectric layer, in accordance with the invention.

FIG. 1 illustrates chamber etch performance for two chambers, implementing the process according to the invention. In these graphs, the data points were generated every two days. As is shown in the graphs of FIG. 1, under the processing conditions of the present invention, the chambers performed for more than 60 days with no tendency towards reduced etch rate mean and sigma performances. That is, the data points show a consistent result throughout the performance test. Additionally and in comparison to FIG. 3, both chambers were put under conditions to etch at a predetermined depth.

FIG. 2 illustrates the variance of the chamber etch performance of the corresponding etch performances in FIG. 1. As can be seen in FIG. 2, repeatable etch rate precision is maintained over the course of usage of the chamber. In particular, when conditions are chosen in accordance with the invention, an etch process comprising removal of a predetermined depth can vary by approximately less than 80 Å. This compares to a deviation of 2.4% over at least 60 days.

Figure 3:
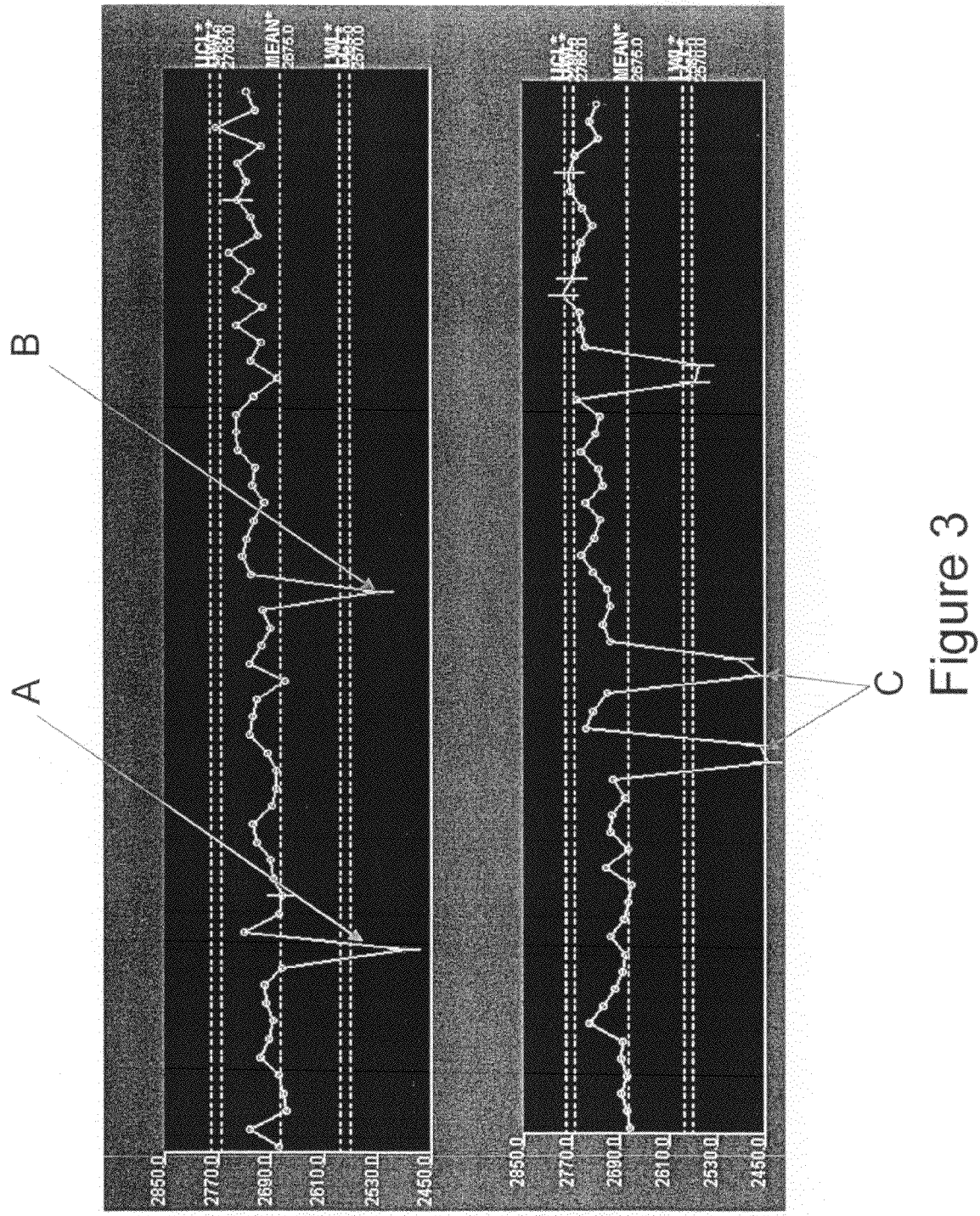
FIG. 3 shows etch chamber performance diagrams of two chambers implementing known processes.

In contrast, FIG. 3, is a graph of the performance of an etch chamber using conventional etching processes. In FIG. 3, the results are plotted for two chambers under the following conditions. FIG. 3 illustrates the variance of the chamber etch performance under standard manufacturing conditions under 48 hours of monitoring. The low data points highlighted by A, B, C points to chamber instability and degradation in which subsequent affects products are affected. These low points in a chamber present poor manufacturability performance and risk of low chip yield on subsequent products. This is due to an unoptimized RIE process used to etch dielectric and metallic film integration schemes.

As in FIGS. 1 and 2, the measurements are repeated every two days to provide the next data point. In the graph of FIG. 3, an etch performance between about 2590 Å and 2770 Å was acceptable; however, as can be seen in the upper graph of FIG. 3, after approximately three weeks of performance, the etch performance becomes drastically substandard (e.g., the downward spike "A"). Immediate maintenance of the chamber remedied the damage and the chamber performed acceptable for about 5 weeks, when the etch performance again became substandard as depicted by the downward spike "B"

As is shown in the lower graph of FIG. 3, loss of etch qualities cannot necessarily be remedied with one maintenance routine. In fact, this graph shows that even after intensive maintenance of the chamber (after the degradation of the chamber was discovered (spike "C")), a second downward spike "C", occurred soon after the remediation.

Figure 5:
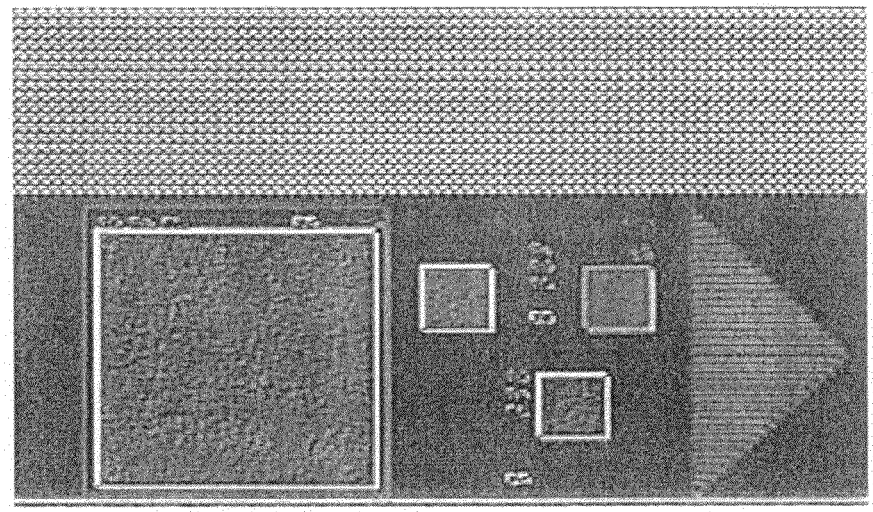
FIGS. 4 and 5 are a side-by-side comparison of structures fabricated using processes of the invention and that of known processes.
Figure 4:
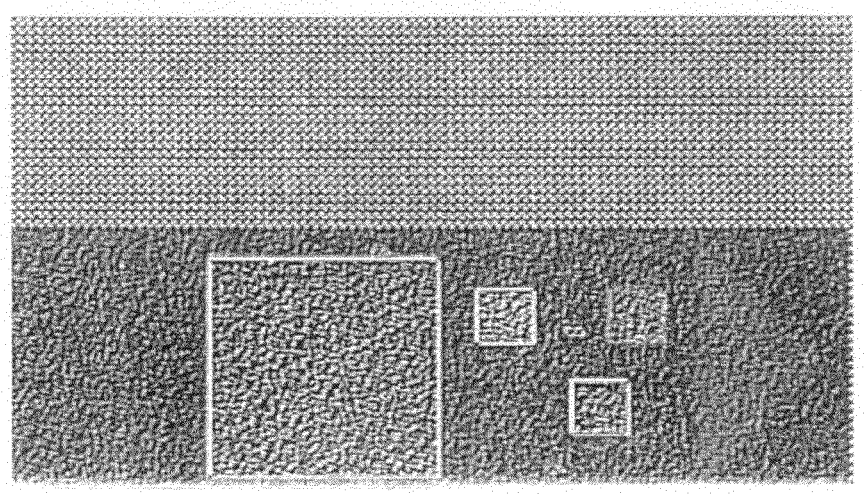

FIGS. 4 and 5 are a side-by-side comparison of structures fabricated using processes of the invention and that of known processes. More specifically, FIG. 4 shows an image of the dielectric and PSPI (Photosensitive Polyimide) pad or other polymer used for hermetic sealing (e.g., g-poly) using a conventional processing; whereas, FIG. 5 shows an image of the dielectric and PSPI pad (or other polymer used for hermetic sealing (e.g., g-poly)) fabricated using the RIE processes according to the invention. As is shown by the comparison of the FIGS. 4 and 5, the processes of the invention result in a more defined product with smooth, homogenous surfaces, clear distinctions of the various areas and accurate borderlines between areas. In contrast, the use of conventional methods shows a highly pined surface.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with the modification within the spirit and scope of the appended claims. For example, the invention can be practiced by using subsequent flow ratios of etch and dilution gases or changing the inside pressure or changing the RF power during application of the process.

What is claimed is:

1. A method comprising:
adjusting a pressure inside a chamber;
introducing a first gas and a dilution gas into the chamber for etching layers above a bonding layer, the layers comprising silicon oxides, silicon nitrides, and titanium nitrides;
adjusting a flow rate of the first gas and the dilution gas to a predetermined flow ratio;
applying a source radio frequency (RF) having a predetermined source power; and
applying a bias RF of about 5 to 30 MHz and having a predetermined bias power,
wherein the first gas is at least one gas selected from the group consisting of tetrafluoromethane, fluorinated ethanes, fluorinated aromates, fluorinated heteroaromates, sulfur hexafluoride, and fluorine.

2. The method according to claim 1, wherein the pressure inside the chamber is between about 5 and 50 millitorr.

3. The method according to claim 1, wherein the pressure inside the chamber is between about 15 and 60 millitorr.

4. The method according to claim 1, wherein the pressure inside the chamber is between about 30 and 50 millitorr.

5. The method according to claim 1, wherein the dilution gas is selected from at least one of helium, neon, argon and xenon.

6. The method according to claim 1, wherein the source power is between 100-1000 Watts.

7. The method according to claim 1, wherein the source power range is between about 250-750 Watts.

8. The method according to claim 1, wherein the source power range is between about 500-4000 Watts.

9. The method according to claim 1, wherein the bias power range is between about 1000-3000 Watts.

10. The method according to claim 1, wherein the flow rate of the first gas of $CF_4$ and the dilution gas is adjusted to either accelerate or decelerate the etch rate.

11. The method according to claim 1, wherein conditions for etching the silicon oxides are 2000 Watts at 13.56 MHz bias frequency, 2000 Watts at 60 Mhz source at a pressure of 150 millitorr and a mixture of the first gas of tetrafluromethane and the dilution gas of argon at a flow rate ratio of 150 $cm^3$/min:300 $cm^3$/min.

12. The method according to claim 1, wherein the ratio of the first gas of $CF_4$ and the dilution gas is $CF_4$/Ar at 50 $cm^3$/min.:1400 $cm^3$/min and the pressure inside the chamber is 30-50 millitorr chamber pressure.

13. The method according to claim 12, wherein the bias power is between 2000 W to 3000 W.

14. The method according to claim 1, wherein the predetermined flow ratio is in a range of about 0.010 to 0.100.

15. The method according to claim 14, wherein the predetermined flow ratio is in the range of about 0.020 to 0.075.

16. The method according to claim 14, wherein the predetermined flow ratio is in the range of about 0.025 to 0.050.

17. The method according to claim 1, wherein the bias RF is between 10-25 MHz.

18. The method according to claim 17, wherein the bias RF is at 13.5 MHz.

19. The method according to claim 18, further comprising providing an isotropic etch mode generated by applying radio frequency of about 60 MHz.

20. A method for homogenously removing metallic and dielectric films on a silicon wafer by a reactive ion etching, comprising:
  reducing a pressure inside an etch chamber subsequent to an etching of an upper layer of the silicon wafer;
  introducing a gas mixture comprising an etch gas having a first flow rate and a supplemental gas having a second flow rate for etching layers above a bonding layer of the silicon wafer;
  adjusting flow rate of at least one of the etch gas and the supplemental gas compared to the etching of the upper layer of the silicon wafer by applying a source radio frequency power; and
  applying a bias radio frequency of about 5 to 30 MHz and bias radio frequency power,
  wherein the etch gas is at least one gas selected from the group consisting of tetrafluoromethane, fluorinated ethanes, fluorinated aromates, fluorinated heteroaromates, sulfur hexafluoride, and fluorine, and
  wherein the layers comprise the metallic and dielectric films, and the metallic and dielectric films comprise silicon oxides, silicon nitrides, and titanium nitrides.

21. The method according to claim 20, wherein the pressure in the etch chamber is between about 10 and 60 millitorr.

22. The method according to claim 20, wherein the supplemental gas is at least one gas selected from the group of helium, neon, argon, xenon, oxygen, and nitrogen.

23. The method according to claim 20, wherein the etch gas has a flow rate ranging from about 5 to 100 cm$^3$/min and the supplemental gas has a flow rate ranging from about 100 to 2000 cm$^3$/min.

24. The method according to claim 20, wherein the source radio frequency power ranges from 250 to 750 Watts and the bias radio frequency ranges from 1000 to 4000 Watts.

25. The method according to claim 20, wherein the etch gas is $CF_4$ and the flow rate of and the supplemental gas is adjusted to either accelerate or decelerate the etch rate.

26. The method according to claim 20, wherein conditions for etching the silicon oxides are 2000 Watts at 13.56 MHz bias frequency, 2000 Watts at 60 Mhz source at a pressure of 150 millitorr and the gas mixture of the etch gas of tetrafluoromethane and the supplemental gas of argon at a flow rate ratio of 150 cm$^3$/min:300 cm$^3$/min.

27. A method for reducing foreign material buildup in etch chambers during reactive ion etching comprising:
  etching metallic and dielectric films in a dilute etch gas atmosphere, wherein the etch gas is diluted with at least one gas selected from the group consisting of helium, neon, argon, oxygen, and nitrogen, at a flow rate ratio of etch gas to dilution gas and at a pressure; and
  applying a source radio frequency and a bias radio frequency of about 5 to 30 MHz and with a power of between 1000 and 3000 Watts,
  wherein the metallic and dielectric films comprise silicon oxides, silicon nitrides, and titanium nitrides.

28. The method according to claim 27, wherein conditions for etching the silicon oxides are 2000 Watts at 13.56 MHz bias frequency, 2000 Watts at 60 Mhz source at a pressure of 150 millitorr and a mixture of the etch gas of tetrafluoromethane and the dilution gas of argon at a flow rate ratio of 150 cm$^3$/min:300 cm$^3$/min.

29. A method comprising:
  adjusting a pressure inside a chamber for etching films above a bond pad, the films comprising silicon oxides, silicon nitrides, and titanium nitrides;
  introducing an etch gas and a dilution gas into the chamber;
  adjusting flow rates of the etch gas and the dilution gas to a predetermined flow ratio;
  applying a source radio frequency (RF) having a predetermined source power; and
  applying a bias RF having a predetermined bias power, to induce the etching of the film,
  wherein the etch gas is at least one gas selected from the group consisting of tetrafluoromethane, fluorinated ethanes, fluorinated aromates, fluorinated heteroaromates, sulfur hexafluoride, and fluorine.

* * * * *